United States Patent
Gu et al.

(10) Patent No.: US 10,531,584 B2
(45) Date of Patent: Jan. 7, 2020

(54) WATERPROOFING METHOD FOR ELECTRONIC DEVICE

(71) Applicant: HUAWEI TECHNOLOGIES CO., LTD., Shenzhen, Guangdong (CN)

(72) Inventors: Xugu Gu, Yokohama (JP); Hui Zhang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/070,865

(22) PCT Filed: Jan. 19, 2016

(86) PCT No.: PCT/CN2016/071385
§ 371 (c)(1),
(2) Date: Jul. 18, 2018

(87) PCT Pub. No.: WO2017/124306
PCT Pub. Date: Jul. 27, 2017

(65) Prior Publication Data
US 2019/0037717 A1    Jan. 31, 2019

(51) Int. Cl.
*H05K 5/06*    (2006.01)
*H05K 5/02*    (2006.01)
(Continued)

(52) U.S. Cl.
CPC ......... *H05K 5/0217* (2013.01); *H05K 5/0004* (2013.01); *H05K 7/1427* (2013.01);
(Continued)

(58) Field of Classification Search
CPC ...... H05K 1/185; H05K 3/284; H05K 5/0217; H05K 5/0047; H05K 5/06; H05K 5/062; H05K 5/065; H05K 5/0095; H05K 7/1427
(Continued)

(56) References Cited

U.S. PATENT DOCUMENTS 3,427,336 A * 2/1969 Tiers .................. C07F 7/12
556/431
3,442,664 A * 5/1969 Heine .................. C08L 83/08
106/2
(Continued)

FOREIGN PATENT DOCUMENTS

CN    101466209 A    6/2009
CN    101568241 A    10/2009
(Continued)

OTHER PUBLICATIONS

Extended European Search Report issued in European Application No. 16885579.9 dated Dec. 13, 2018, 6 pages.
(Continued)

*Primary Examiner* — Brian K Talbot
(74) *Attorney, Agent, or Firm* — Fish & Richardson P.C.

(57) ABSTRACT

The present disclosure relates to a waterproofing method for an electronic device. In one example method, silane is coated on an inner wall of a first housing of the electronic device and an inner wall of a second housing of the electronic device. The first and second housings and a main board of the electronic device are assembled. Fluoride is injected into a cavity of the electronic device through a liquid inlet hole on the first housing. An integral continuous waterproofing membrane is formed on the inner walls of the first and second housings through chemical reaction between the silane and the fluoride.

3 Claims, 4 Drawing Sheets

(51) Int. Cl.
*H05K 5/00* (2006.01)
*H05K 7/14* (2006.01)
*H05K 3/28* (2006.01)
*H05K 1/18* (2006.01)

(52) U.S. Cl.
CPC ............ *H05K 1/185* (2013.01); *H05K 3/284* (2013.01); *H05K 5/0047* (2013.01); *H05K 5/0095* (2013.01); *H05K 5/06* (2013.01); *H05K 5/062* (2013.01); *H05K 5/066* (2013.01)

(58) Field of Classification Search
USPC ................................................ 427/96.2, 96.6
See application file for complete search history.

(56) References Cited

U.S. PATENT DOCUMENTS

| | | | | |
|---|---|---|---|---|
| 7,027,595 | B2* | 4/2006 | Miyazaki | H04Q 1/10 379/325 |
| 7,253,444 | B2* | 8/2007 | Ikeda | B29C 39/10 257/81 |
| 2001/0004316 | A1* | 6/2001 | Denzene | H01R 13/5219 361/816 |
| 2003/0211736 | A1* | 11/2003 | Ludviksson | C23C 16/045 438/683 |
| 2005/0139850 | A1 | 6/2005 | Ikeda | |
| 2006/0293399 | A1 | 12/2006 | Chan | |
| 2009/0162663 | A1 | 6/2009 | Wu et al. | |
| 2014/0078651 | A1 | 3/2014 | Zhou et al. | |
| 2014/0255634 | A1 | 9/2014 | Na | |
| 2014/0321079 | A1 | 10/2014 | Kim et al. | |
| 2015/0125500 | A1 | 5/2015 | Watanabe et al. | |

FOREIGN PATENT DOCUMENTS

| | | |
|---|---|---|
| CN | 102548313 A | 7/2012 |
| CN | 202985984 U | 6/2013 |
| CN | 103687356 A | 3/2014 |
| CN | 104053315 A | 9/2014 |
| CN | 104125736 A | 10/2014 |
| EP | 0113073 A1 | 7/1984 |
| GB | 2115084 A | 9/1983 |
| JP | 101318282 A | 12/1989 |
| JP | 2005197006 A | 7/2005 |
| JP | 2014003206 A | 1/2014 |
| KR | 20070034256 A | 3/2007 |
| KR | 20080114491 | 12/2008 |
| KR | 20150051155 A | 5/2015 |
| WO | 2016017075 A1 | 2/2016 |

OTHER PUBLICATIONS

International Search Report issued in International Application No. PCT/CN2016/071385 dated Oct. 24, 2018, 21 pages.

Chinese Office Action issued in Chinese Application No. 201680028355 dated Mar. 15, 2019, 13 pages.

Office Action issued in Japanese Application No. 2018-555803 dated Sep. 2, 2019, 5 pages (with English translation).

* cited by examiner

WATERPROOFING METHOD FOR ELECTRONIC DEVICE

CROSS-REFERENCE TO RELATED APPLICATIONS

This application is a National Stage of International Application No. PCT/CN2016/071385, filed on Jan. 19, 2016, which is hereby incorporated by reference in its entirety.

TECHNICAL FIELD

Embodiments of the present invention relate to electronic technologies, and in particular, to a waterproofing method and apparatus for an electronic device, and an electronic device.

BACKGROUND

With development of electronic technologies, electronic devices such as mobile phones, cameras, tablet computers, and removable storage devices are more widely used. If falling into water, the electronic devices have faults such as circuit board damage and data loss, causing large losses and troubles to users. Therefore, a waterproof design of the electronic devices is increasingly important.

In the prior art, a fluoride liquid for waterproofing is coated on a main board of an electronic device by using a dispenser, and then the main board and components of the electronic device such as housings, a keyboard and a display screen are assembled, thereby implementing the waterproof design of the electronic device.

However, in the foregoing method, a gap exists between the housings of the assembled electronic device. Although the fluoride liquid for waterproofing is already coated on the main board, water can still enter the main board through the gap between the housings. If water stays in the housings for a long time, the fluoride liquid on the main board is caused to lose efficacy, and a fault such as circuit board damage occurs. Therefore, waterproof reliability of the electronic device in the prior art is poor.

SUMMARY

Embodiments of the present invention provide a waterproofing method and apparatus for an electronic device, and an electronic device, to prevent water from entering a main board through a gap between housings of an electronic device and completely isolate the main board from the outside, so as to improve waterproof reliability of the electronic device.

According to a first aspect, an embodiment of the present invention provides a waterproofing method for an electronic device, where the electronic device includes a first housing, a second housing, and a main board. The method includes:

coating silane on an inner wall of the first housing and an inner wall of the second housing;

assembling the first housing, the second housing, and the main board, and injecting fluoride into a cavity of the electronic device through a liquid inlet hole on the first housing; and forming an integral continuous waterproofing membrane on the inner wall of the first housing and the inner wall of the second housing through chemical reaction between the silane and the fluoride.

With reference to the first aspect, in a first possible implementation of the first aspect, the silane is (heptadecafluoro-1,1,2,2-tetrahydrodecyl)-1-trichlorosilane.

With reference to the first aspect or the first possible implementation of the first aspect, in a second possible implementation of the first aspect, the fluoride is polyfluorooctane or fluorinated polyol.

According to a second aspect, an embodiment of the present invention provides a waterproofing apparatus for an electronic device, where an inner wall of a housing of the waterproofing apparatus for an electronic device has a waterproofing membrane that covers the entire inner wall of the housing, and the waterproofing membrane is generated after silane reacts with fluoride.

According to a third aspect, an embodiment of the present invention provides an electronic device, including a first housing, a second housing, and a main board, where the first housing has a liquid inlet hole, an inner wall of a housing formed by clapping the first housing and the second housing is covered by a waterproofing membrane, and the waterproofing membrane is generated after silane reacts with fluoride; and the main board is located inside a cavity formed by clapping the first housing and the second housing.

According to the waterproofing method and apparatus for an electronic device, and the electronic device that are provided in the embodiments of the present invention, the silane is coated on the inner wall of the first housing and the inner wall of the second housing; the first housing, the second housing, and the main board are assembled, and the fluoride is injected into the cavity of the electronic device through the liquid inlet hole on the first housing; and the integral continuous waterproofing membrane is formed on the inner walls of the first housing and the second housing of the electronic device through the chemical reaction between the silane and the fluoride. The integral continuous waterproofing membrane is attached to the inner wall of the first housing and the inner wall of the second housing, and fills a gap between the first housing and the second housing. In this way, water is prevented from entering the cavity of the electronic device and the main board is completely isolated from the outside, thereby improving waterproof reliability of the electronic device.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following clearly and completely describes the technical solutions in the embodiments of the present invention with reference to the accompanying drawings in the embodiments of the present invention. Apparently, the described embodiments are merely some but not all of the embodiments of the present invention. All other embodiments obtained by persons of ordinary skill in the art based on the embodiments of the present invention without creative efforts shall fall within the protection scope of the present invention.

A waterproofing method for an electronic device provided in the embodiments of the present invention may be applied to a waterproof design of an electronic device such as a mobile phone, a camera, a tablet computer, or a removable storage device. Before the electronic device is assembled, silane is coated on an inner wall of a first housing and an inner wall of a second housing, and then the first housing, the second housing, and a main board are assembled. Fluoride is injected into a cavity of the electronic device through a liquid inlet hole on the first housing. An integral continuous waterproofing membrane is formed on the inner walls of the first housing and the second housing of the electronic device through chemical reaction between the silane and the fluoride. The integral continuous waterproofing membrane is attached to the inner wall of the first housing and the inner wall of the second housing, and fills a gap between the first housing and the second housing. In this way, water is prevented from entering the cavity of the electronic device and the main board is completely isolated from the outside, thereby improving waterproof reliability of the electronic device.

The following describes the technical solutions of the present invention in detail by using specific embodiments. The following several specific embodiments may be combined. Same or similar concepts or processes may not be described in detail in some embodiments.

Figure 1:
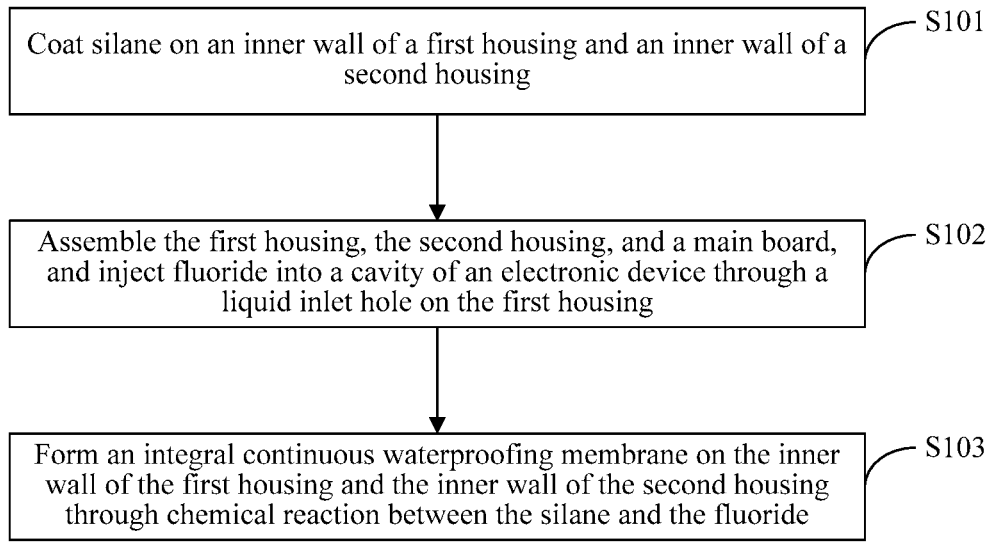
FIG. 1 is a schematic flowchart of a waterproofing method for an electronic device according to an embodiment of the present invention.

FIG. 1 is a schematic flowchart of a waterproofing method for an electronic device according to an embodiment of the present invention. The electronic device in this embodiment of the present invention includes a first housing, a second housing, and a main board. As shown in FIG. 1, the waterproofing method for an electronic device provided in this embodiment of the present invention includes the following steps.

S101: Coat silane on an inner wall of the first housing and an inner wall of the second housing.

Figure 2A:
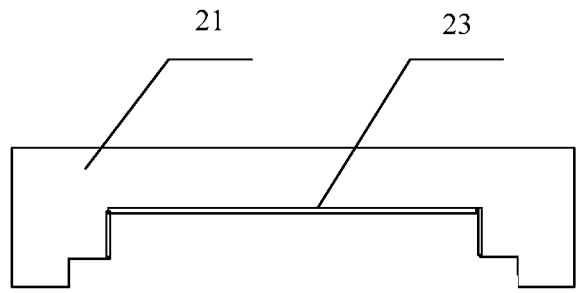
FIG. 2A is a schematic structural diagram of S101 in the embodiment provided in FIG. 1.
Figure 2A:
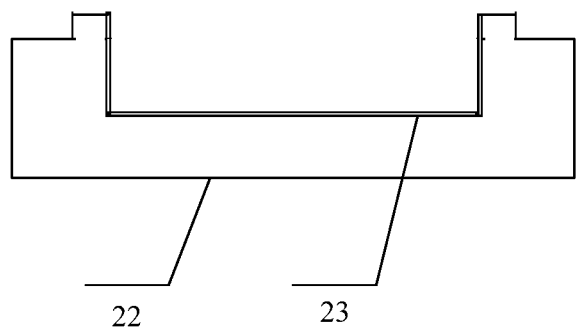

Specifically, S101 is performed before the electronic device is assembled. FIG. 2A is a schematic structural diagram of S101 in the embodiment provided in FIG. 1. As shown in FIG. 2A, the silane 23 is coated on the inner wall of the first housing 21 and the inner wall of the second housing 22. For example, the electronic device in this embodiment may be a mobile phone, the first housing 21 may be a front panel of the mobile phone, and the second housing 22 may be a rear cover of the mobile phone. The silane 23 in this embodiment may be fluorosilane, for example, (heptadecafluoro-1,1,2,2-tetrahydrodecyl)-1-trichlorosilane. The silane 23 may be coated on the inner walls of the first housing 21 and the second housing 22 by using a coating method, for example, by using a vacuum coating method such as magnetron sputtering coating or plasma beam sputtering coating. Alternatively, the silane 23 may be coated on the inner walls of the first housing 21 and the second housing 22 by using a compressed air atomizer. The compressed air atomizer may form a high-speed airflow through a small pipe opening based on the Venturi (Venturi) spray principle and by using compressed air, to generate negative pressure that drives the silane to be sprayed to an obstacle. At high-speed impact, the silane splashes around and causes liquid drops to change into mist particles and be sprayed from an air outlet pipe. In this way, the silane is coated on the inner walls of the first housing 21 and the second housing 22.

It should be noted that, the inner walls of the first housing 21 and the second housing 22 refer to walls of a cavity formed by clapping the first housing 21 and the second housing 22.

S102: Assemble the first housing, the second housing, and the main board, and inject fluoride into a cavity of the electronic device through a liquid inlet hole on the first housing.

Figure 2B:
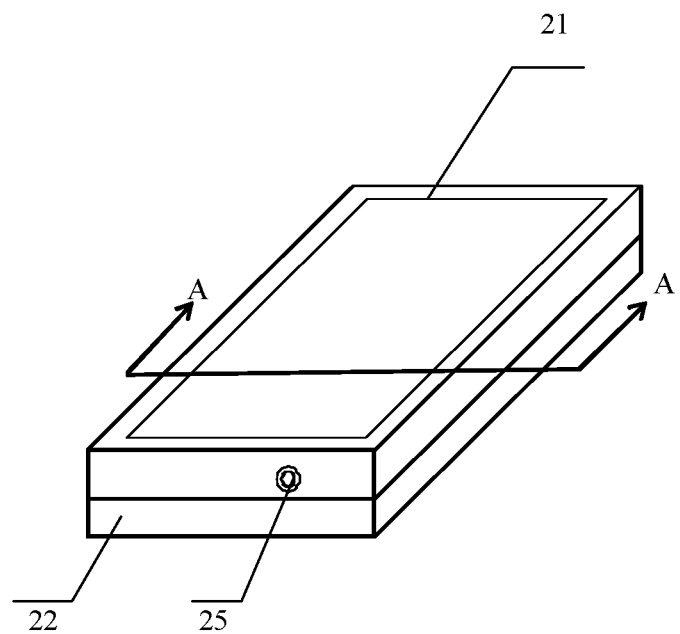
FIG. 2B is a schematic structural diagram of S102 in the embodiment provided in FIG. 1.
Figure 2C:
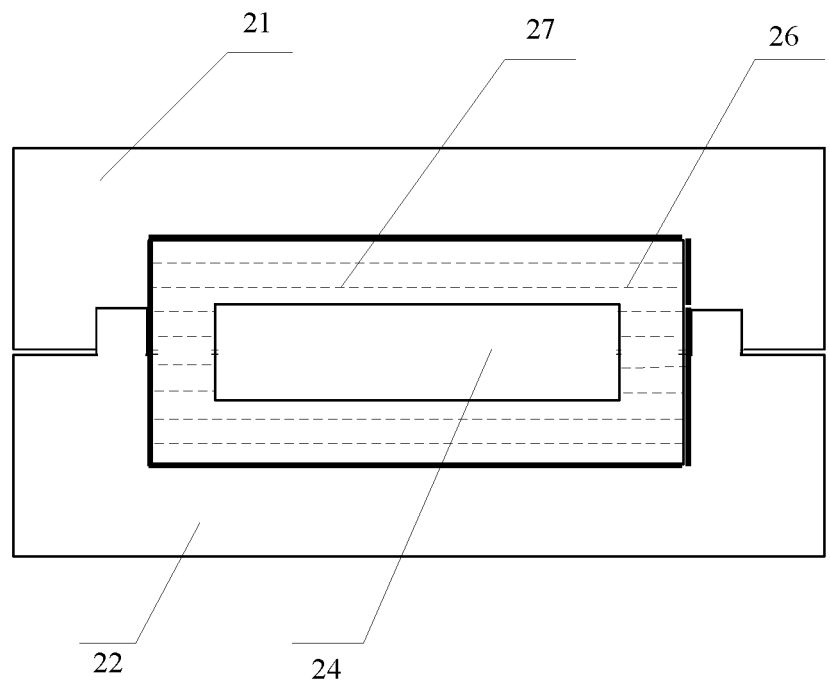
FIG. 2C is a schematic sectional view along A-A in FIG. 2B.

Specifically, FIG. 2B is a schematic structural diagram of S102 in the embodiment provided in FIG. 1, and FIG. 2C is a schematic sectional view along A-A in FIG. 2B. Based on S101, referring to FIG. 2A to FIG. 2C, the first housing 21 coated with the silane 23, the second housing 22 coated with the silane 23, and the main board 24 are assembled, and the fluoride 27 is injected into the cavity 26 of the electronic device through the liquid inlet hole 25 on the first housing 21. The fluoride in this embodiment may be a C4 fluorocarbon or a C8 fluorocarbon, for example, polyfluorooctane or fluorinated polyol, and an inherent function such as a communication function or a playback function of the electronic device is not affected by the fluoride.

After the first housing 21, the second housing 22, and the main board 24 are assembled, the first housing 21 and the second housing 22 form the cavity 26, and the main board 24 is located inside the cavity 26. The liquid inlet hole 25 on the first housing 21 may be a hole specially provided on the first housing 21 for injecting the fluoride 27, or may be a hole originally provided on the first housing 21 for implementing some functions of the electronic device, for example, a speaker hole, a subscriber identity module (Subscriber Identity Module, SIM for short) card eject hole, or a microphone hole. The liquid inlet hole 25 is provided at a location enabling the fluoride 27 injected through the liquid inlet hole 25 to successfully reach any corner in the cavity 26. The liquid inlet hole 25 may have a diameter ranging from 0.5 millimeter to 2 millimeters. The fluoride 27 may be injected into the cavity 26 by using a pressure spray method, such as syringe injection, spray gun injection, ejector pump spray, or jet vacuum ejector spray. During pressure spray, spray pressure may be 10 pounds per square inch (pounds per square inch, psi for short) to 1000 psi.

An injection amount of the fluoride 27 may be obtained by collecting statistics. When an injection rate is specified, the injection amount of the fluoride 27 to be injected may be controlled by a preset injection time period.

S103: Form an integral continuous waterproofing membrane on the inner wall of the first housing and the inner wall of the second housing through chemical reaction between the silane and the fluoride.

Figure 2D:
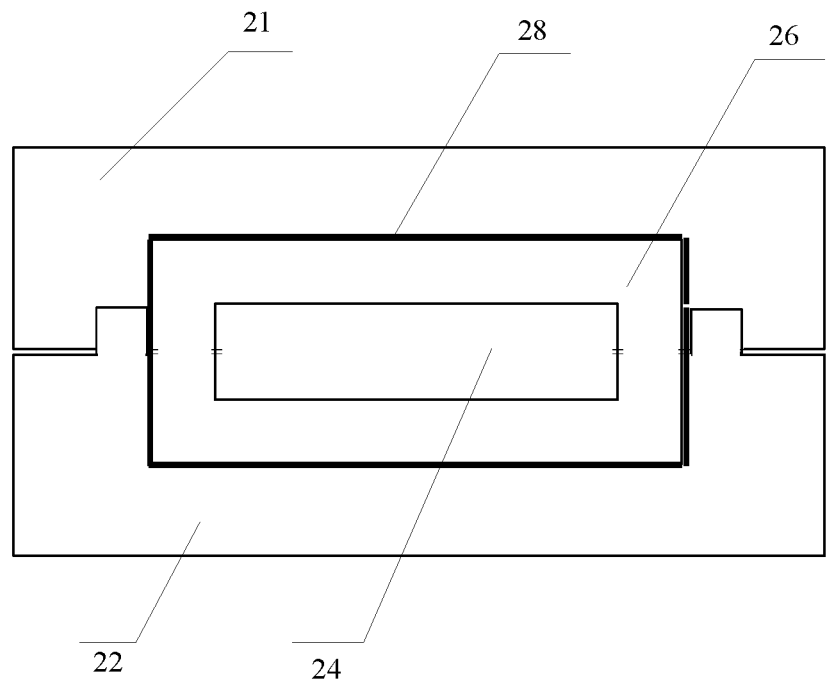
FIG. 2D is a schematic structural diagram of an implementation of S103 in the embodiment provided in FIG. 1.

Specifically, FIG. 2D is a schematic structural diagram of an implementation of S103 in the embodiment provided in FIG. 1. Referring to FIG. 2A to FIG. 2D, the fluoride 27 injected into the cavity 26 through the liquid inlet hole 25 chemically reacts only with the silane 23, and the integral continuous waterproofing membrane 28 is eventually formed on the inner wall of the first housing 21 and the inner wall of the second housing 22. In other words, the waterproofing membrane 28 eventually covers an inner wall of a housing formed by clapping the first housing 21 and the second housing 22. That the waterproofing membrane 28 is integral continuous means that the waterproofing membrane 28 is of a seamless integrated structure, and is attached to the inner wall of the first housing 21 and the inner wall of the second housing 22, to wrap all internal components of the electronic device. It should be noted that, the silane 23 may chemically react with the fluoride 27 at room temperature for a preset time period, to form the integral continuous waterproofing membrane 28.

Figure 2E:
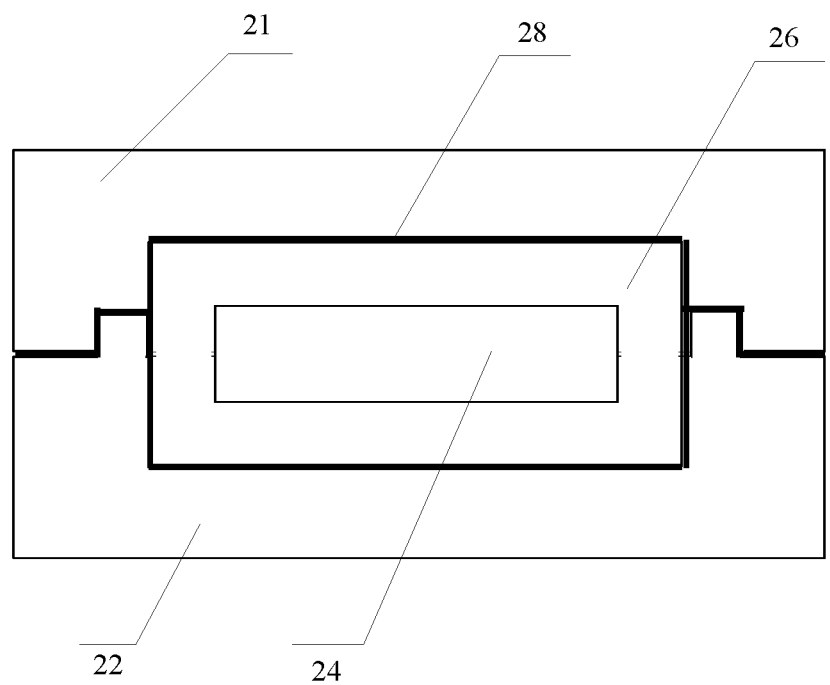
FIG. 2E is a schematic structural diagram of another implementation of S103 in the embodiment provided in FIG. 1.

FIG. 2E is a schematic structural diagram of another implementation of S103 in the embodiment provided in FIG. 1. A difference between FIG. 2D and FIG. 2E is as follows: The waterproofing membrane 28 in FIG. 2D covers the wall of the cavity 26 formed by clapping the first housing 21 and the second housing 22, but the waterproofing membrane 28 in FIG. 2E covers a junction at which the first housing 21 is in contact with the second housing 22 in addition to covering the wall of the cavity 26. This further improves waterproof reliability.

It should be noted that, after the silane 23 fully reacts with the fluoride 27, the excess fluoride 27 may be poured out through the liquid inlet hole 25. The fluoride 27 that cannot be poured out can be evaporated through natural evaporation.

Optionally, after the integral continuous waterproofing membrane 28 is formed, if the liquid inlet hole 25 is a specially provided hole, the liquid inlet hole 25 may be sealed and paint-sprayed, so that the electronic device looks finer.

According to the waterproofing method for an electronic device provided in this embodiment of the present invention, the silane is coated on the inner walls of the first housing and the second housing; the first housing, the second housing, and the main board are assembled, and the fluoride is injected into the cavity of the electronic device through the liquid inlet hole on the first housing; and the integral continuous waterproofing membrane is formed on the inner walls of the first housing and the second housing of the electronic device through the chemical reaction between the silane and the fluoride. The integral continuous waterproofing membrane is attached to the inner wall of the first housing and the inner wall of the second housing, and fills a gap between the first housing and the second housing. In this way, water is prevented from entering the cavity of the electronic device and the main board is completely isolated from the outside, thereby improving waterproof reliability of the electronic device.

Figure 3A:
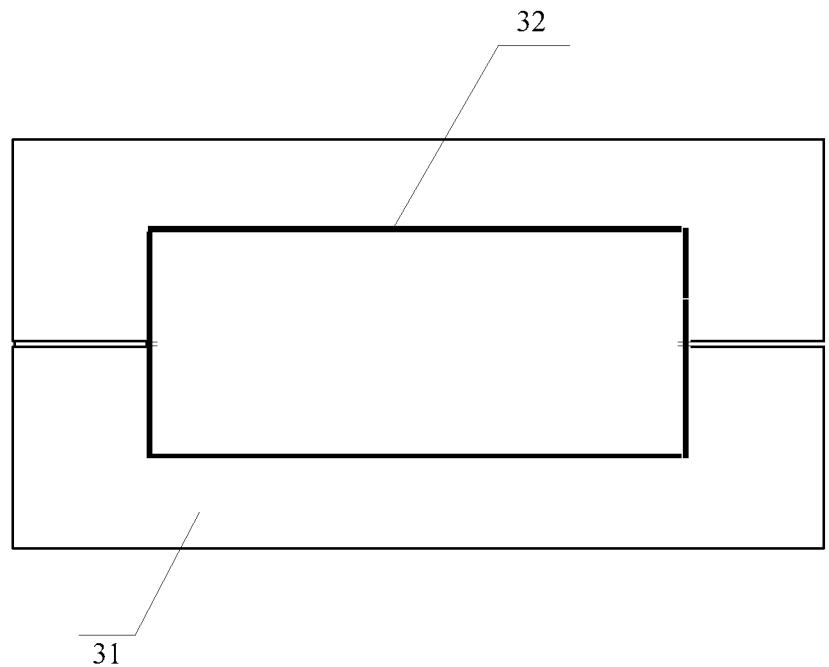
FIG. 3A is a schematic structural diagram of an implementation of a waterproofing apparatus for an electronic device according to an embodiment of the present invention.

FIG. 3A is a schematic structural diagram of an implementation of a waterproofing apparatus for an electronic device according to an embodiment of the present invention. As shown in FIG. 3A, an inner wall of a housing 31 of the waterproofing apparatus for an electronic device provided in this embodiment has a waterproofing membrane 32 that covers the entire inner wall of the housing. The waterproofing membrane 32 is generated after silane reacts with fluoride.

The silane may be coated on the inner wall of the housing 31 before the waterproofing apparatus for an electronic device is assembled.

Figure 3B:
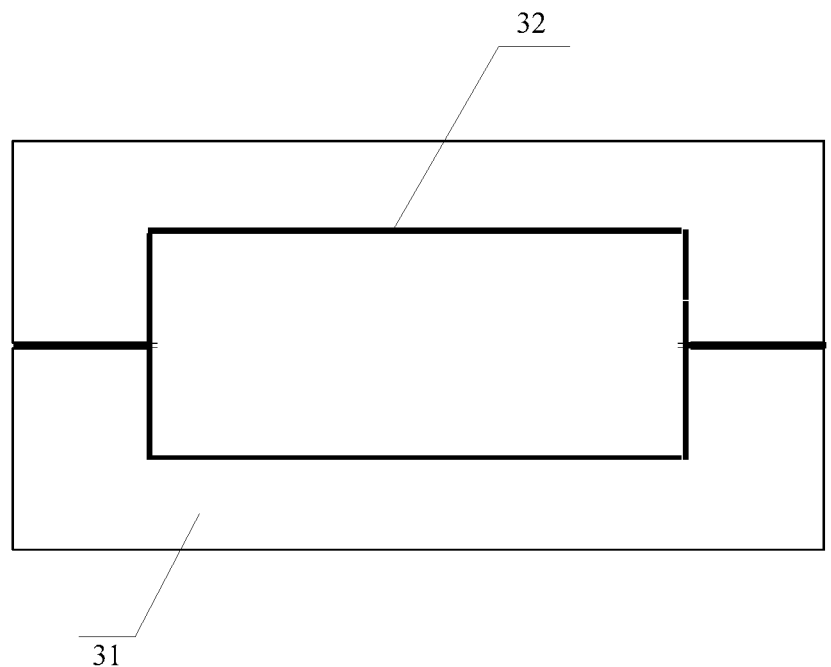
FIG. 3B is a schematic structural diagram of another implementation of a waterproofing apparatus for an electronic device according to an embodiment of the present invention.

FIG. 3B is a schematic structural diagram of another implementation of a waterproofing apparatus for an electronic device according to an embodiment of the present invention. A difference between FIG. 3A and FIG. 3B is as follows: The waterproofing membrane 32 in FIG. 3A covers a wall of a cavity formed by clapping the housing 31, but the waterproofing membrane 32 in FIG. 3B covers a junction of the housing 31 in addition to covering the wall of the cavity. This further improves waterproof reliability.

The waterproofing apparatus for an electronic device provided in this embodiment of the present invention may be specifically implemented by using the method embodiment shown in FIG. 1 with a similar principle. Details are not described herein again.

According to the waterproofing apparatus for an electronic device provided in this embodiment of the present invention, the inner wall of the housing has the waterproofing membrane that covers the entire inner wall of the housing, where the waterproofing membrane is generated after the silane reacts with the fluoride. The waterproofing membrane is attached to the inner wall of the housing of the waterproofing apparatus for an electronic device, so that water is prevented from entering the cavity of the waterproofing apparatus for an electronic device, thereby improving waterproof reliability of the electronic device.

An embodiment of the present invention further provides an electronic device, including a first housing, a second housing, and a main board. The first housing has a liquid inlet hole. An inner wall of a housing formed by clapping the first housing and the second housing is covered by a waterproofing membrane. The waterproofing membrane is generated after silane reacts with fluoride. The main board is located inside a cavity formed by clapping the first housing and the second housing.

The electronic device provided in this embodiment of the present invention may be specifically implemented by using the method embodiment shown in FIG. 1 with a similar principle. Details are not described herein again.

The electronic device provided in this embodiment of the present invention includes the first housing, the second housing, and the main board. The first housing has the liquid inlet hole. The inner wall of the housing formed by clapping the first housing and the second housing is covered by the waterproofing membrane. The waterproofing membrane is generated after silane reacts with fluoride. The main board is located inside the cavity formed by clapping the first housing and the second housing. The integral continuous waterproofing membrane is attached to the inner wall of the first housing and the inner wall of the second housing, and fills a gap between the first housing and the second housing. In this way, water is prevented from entering the cavity of the electronic device and the main board is completely isolated from the outside, thereby improving waterproof reliability of the electronic device.

In the several embodiments provided in this application, it should be understood that the disclosed apparatus and method may be implemented in other manners. For example, the described device embodiment is merely an example. For example, the unit or module division is merely logical function division and may be other division in actual implementation. For example, multiple units or modules may be combined or integrated into another system, or some features may be ignored or not performed. In addition, the displayed or discussed mutual couplings or direct couplings or communication connections may be implemented by using some interfaces. The indirect couplings or communication connections between the devices or modules may be implemented in electronic, mechanical, or other forms.

The modules described as separate parts may or may not be physically separate, and parts displayed as modules may or may not be physical modules, may be located in one position, or may be distributed on multiple network units. Some or all of the modules may be selected according to actual needs to achieve the objectives of the solutions of the embodiments.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A waterproofing method for an electronic device, wherein the electronic device comprises a first housing, a second housing, and a main board, and the method comprises;
   coating silane on an inner wall of the first housing and an inner wall of the second housing;
   assembling the first housing, the second housing, and the main board;
   injecting fluoride into a cavity of the electronic device through a liquid inlet hole on the first housing; and
   forming an integral continuous waterproofing membrane on the inner wall of the first housing and the inner wall of the second housing through chemical reaction between the silane and the fluoride.

2. The method according to claim 1, wherein the silane is (heptadecafluoro-1,1,2,2-tetrahydrodecyl)-1-trichlorosilane.

3. The method according to claim 1, wherein the fluoride is polyfluorooctane or fluorinated polyol.

* * * * *